United States Patent
Assmann

[11] Patent Number: 5,221,663
[45] Date of Patent: Jun. 22, 1993

[54] METHOD FOR REPAIRING AN OXIDE SUPERCONDUCTING CONNECTING LINE

[75] Inventor: Helmut Assmann, Dormitz, Fed. Rep. of Germany

[73] Assignee: Siemens Aktiengesellschaft, Munich, Fed. Rep. of Germany

[21] Appl. No.: 731,379

[22] Filed: Jul. 16, 1991

Related U.S. Application Data

[63] Continuation of Ser. No. 602,068, Oct. 25, 1990, abandoned, which is a continuation of Ser. No. 322,773, Mar. 13, 1989, abandoned.

[30] Foreign Application Priority Data

Mar. 18, 1988 [DE] Fed. Rep. of Germany ....... 3808474

[51] Int. Cl.$^5$ .......................... B05D 5/12; B32B 35/00
[52] U.S. Cl. ........................................ 505/1; 505/736; 505/701; 505/703; 427/62; 427/140; 427/126.3
[58] Field of Search .................. 505/1, 736, 701, 703; 148/277; 427/62, 63, 126.3, 140

[56] References Cited

U.S. PATENT DOCUMENTS 4,826,808  5/1989  Yurek et al. .......................... 505/1

FOREIGN PATENT DOCUMENTS 1285442  8/1972  United Kingdom .

OTHER PUBLICATIONS

Lemonick, "Superconductors!", Time, vol. 129, No. 19, May 1987 P64–P65.
Gurvitch et al. "Preparation and Substrate Reactions of Superconducting Y—Ba—Cu—O films" Appl. Phys. Lett. vol. 51(13) Sep. 1987 P1027–1029.
Sheng et al "New 120k Tl13 Ca—Ba—Cu—O Superconductor" Appl. Phys. lett. 52(20) May 1988 P1738–1740.
Maeda et al "A new high-Tc oxide superconductor without a rare earth element" Jpn. J. Appl. Phys. vol. 27(2) Feb. 1988 L209–210.
He et al "Superconductivity above 90k Ba—Y—Cu—Nb—O quaternary-oxide system" Kexue Tonsbao (Sci. Bull.) (China) vol. 32(20) Oct. 1987 P1402–1404.
Nature, vol. 326, Apr. 30, 1987, pp. 857–859.
Japanese Journal of Applied Physics/Part 2: Letters, vol. 26, No. 4, Apr. 1987, pp. L334–L336.
Appl. Physics Lett. 51(7), Aug. 17, 1987 pp. 538–539.
Advanced Ceramic Materials-Ceramic Superconductors, vol. 2, No. 3B, Jul. 1987, pp. 530–538, Acers, Westerville.
Ohio, US; C. K. Chiang et al.; "Low temperature thermal processing of $Ba_2YCu_3O_{7-x}$ superconducting ceramics".
Applied Physics A, vol. 45, Mar. 1988, pp. 261–263; Springer-Verlag, Berlin, Germany "High-Tc superconductivity . . . etc".
Publication: Journal of Crystal Growth 91 (Aug. 1988) Aug. II, No. 3, Amsterdam. pp. 352–354.
Publication: Appl. Phys. Lett. 52(21) 23, May 1988, pp. 1828–1830.

Primary Examiner—Michael Lusigan
Assistant Examiner—Roy V. King
Attorney, Agent, or Firm—Herbert L. Lerner; Laurence A. Greenberg

[57] ABSTRACT

A method for producing an oxide superconducting connecting line includes initially coating a line with at least one layer of a crystalline or amorphous metal alloy forming a superconductive oxide. The line is subsequently heated to a temperature below the melting temperature of the oxide. A gas containing oxygen is simultaneously brought into contact with the accessible surface forming an oxide film which is superconductive upon cooling. When the oxide film is damaged at a certain location, the still-undamaged layer is exposed to the oxygen-containing gas and the line is heated at the damaged location. A superconducting film is again formed. A combination superconducting connecting line and an apparatus for producing the superconducting connecting line is also disclosed.

2 Claims, 1 Drawing Sheet

METHOD FOR REPAIRING AN OXIDE SUPERCONDUCTING CONNECTING LINE

This application is a continuation of application Ser. No. 07/602,068, filed Oct. 23, 1990, now abandoned, which was a continuation of application Ser. No. 07/322,773, filed Mar. 13, 1989, now abandoned.

BACKGROUND OF THE INVENTION

Field of the Invention

The invention relates to a method and apparatus for producing a superconducting connecting line as well as a line produced according to the method.

Oxide superconductors having a transition temperature so high that cooling with liquid nitrogen is sufficient to assure superconduction are known. Previously, these oxides were generally produced by means of powder metallurgy. However, these oxides are quite brittle and thus can only be formed with great difficulty. Accordingly, connecting lines that are to be used to supply public electric utility cannot be made solely from the known oxides. For instance, a metal base having an oxide film applied thereto is better suited for making a connecting line. However, if the oxide is applied to the base using conventional methods there is no compressive stress in the oxide film. Therefore unequal thermal expansion can produce cracks in the oxide film, which hinder or even interrupt continuous superconduction.

Consequently, the application of a finished oxide onto a foundation is not feasible if the connecting line produced in this way is not accessible at all points afterward. Yet such is the case if the connecting line is laid or run over large distances. A further consideration is that below-ground laying or placement of the line should also be possible.

It is accordingly an object of the invention to provide a superconducting connecting line and a method and apparatus for producing the same, which overcomes the hereinafore-mentioned disadvantages of the heretofore-known methods and devices of this general type, in which adhesion of the oxide film to the base is assured by compressive stress and which can be used for supplying electricity for public utilities. Very good adhesion of the oxide film to a substrate should be assured, so that interruptions in the superconduction are kept to a minimum. In particular, the method should also be usable for easy repair of an already-installed, laid or run connecting line after a defect has occurred.

SUMMARY OF INVENTION

With the foregoing and other objects in view there is provided, in accordance with the invention, a method for producing a superconducting connecting line, which comprises initially installing, laying or running a line coated with at least one layer or outer layer of a crystalline or amorphous metal alloy forming a superconductive oxide and having a given melting temperature and an accessible surface, subsequently heating the installed, laid or run line to a temperature below the given melting temperature, and simultaneously bringing a gas containing oxygen into contact with the accessible surface forming an oxide film being superconductive upon cooling.

In accordance with another mode of the invention, there is provided a method which comprises employing a metal alloy from the group consisting of an alloy forming a superconducting oxide having the composition $Ma_1Mb_2Cu_3$ and a Ma-Mb-niobium-copper alloy, as the layer or outer layer, where Ma is a rare earth metal preferably from the group consisting of yttrium, lanthanum and a lanthanide, and Mb is an alkaline earth metal preferably from the group consisting of barium and strontium.

In accordance with a further mode of the invention, there is provided a method which comprises employing a bismuth-strontium-calcium-copper or bismuth-lead-strontium-calcium-copper, or bismuch-lead-antimony-strontium-calcium-copper, or thallium-calcium-barium-copper crystalline or amorphous metal alloy, in particular $Bi_2Sr_3Ca_3Cu_2$ or $Bi_2Sr_2Ca_2Cu$ $Bi_2Sr_2CaCu_2$ or $Bi_2Sr_2Ca_2Cu_3$ or $Bi_{1.7}Pb_{0.3}Sr_2Ca_2Cu_{3.6}$ or $Bi_{1.6}Pb_{0.3}Sb_{0.1}$—$Sr_2Ca_2Cu_3$ or $Tl_2Ca_{n-1}Ba_2Cu_n$ or $TlCa_{n-1}Ba_2Cu_n$, where n is equal to 2, 3, 4 or 5, or $TlCa_2Ba_3Cu_4$ forming a superconducting oxide, as the layer.

According to the invention, the oxide formation is performed first on the already-installed, laid or run line. This has the advantage of precluding damage to the oxide film while the line is being laid. Due to the oxidation in the laid tube according to the invention, a compressive stress is produced in the oxide film, which assures particularly durable adhesion of the oxide film to its base. This compressive stress can be ascribed to the fact that the density of a substance decreases as a result of the oxidation process. The density of the superconducting oxides is therefore less than the density of the metal alloy forming the superconducting oxide. With the method according to the invention, the oxide front is progressively introduced farther and farther into the metal layer as a result of a solid-state reaction. The speed of the inward growth is a function of the temperature. The temperature, however, is always below the melting point of the alloy.

In order to produce a known superconducting oxide having the correct composition, for instance $YBa_2CU_3O_{6.85}$, it is necessary to provide a certain partial oxygen pressure in the oxidation atmosphere as a function of the temperature selected.

With the method according to the invention, a further increase in the compressive stress and therefore in the adhesion of the oxide to its substrate is attained by cooling down the finished connecting line. For manufacture, the line is heated to a temperature below the melting point of the alloy. In order to make the finished connecting line superconductive, cooling to the operating temperature of the applicable superconductor, which for instance may be the temperature of the liquid nitrogen, is necessary. As a result of this cooling, an additional compressive strain is produced in the oxide film.

A connecting line produced by the method of the invention is even insensitive to deformation, because of the good adhesion of the oxide film. This has the advantage of ensuring that external forces acting upon the laid line, such as heaving soil, which act upon lines laid underground, are of no significance to the status of the oxide film.

Due to the high compressive stress, a very high pressure acts upon the oxide film. As a result of this high pressure, which is generated for the first time by the method according to the invention, it is even possible to attain an increase in the transition temperature for superconduction, as compared with a non-pressure-loaded identical oxide.

The connecting line produced by the method of the invention is insensitive to mechanical strains and is distinguished over the known art by a higher transition temperature. Moreover, an advantage attained with the method according to the invention is that a homogeneous oxide film is always produced, because the oxidation process is performed on the already-laid line. The method according to the invention is also suitable for eliminating defects in the oxide film directly in a lid line. In order to do so, it is unnecessary to locate the defect, which is virtually impossible in underground lines. If the connecting line is heated and coated with oxidizing gas, according to the method of the invention, then defects in the oxide film are eliminated by the formation of new oxides. The method of the invention is accordingly additionally advantageous for the repair of already-laid or installed superconducting connecting lines.

In accordance with an added mode of the invention, there is provided a method which comprises heating the line to between 400° C. and 600° C. for oxidation of the metal alloy. Then, in accordance with an additional mode of the invention, there is provided a method which comprises contacting a surface of the line having the layer of metal alloy with an inert gas containing oxygen. At the temperature specified, in accordance with yet another mode of the invention, there is provided a method which comprises contacting a surface of the line with a mixture of an inert gas and oxygen having a 1% proportion of oxygen. With these parameters to be used by way of example, a highly suitable superconducting connection is produced.

For example, in accordance with yet a further mode of the invention, there is provided a method which comprises employing an electrically conductive material for the line. This has the advantage of ensuring that in the event the superconduction fails during operation of the connecting line, a flow of current still exists through the electrically conductive but non-superconducting material. A failure of the superconduction would occur even if the supply of cooling medium were interrupted.

In accordance with yet an added mode of the invention, there is provided a method which comprises electrically heating the installed or laid line for oxidation. To this end, either an electrical heating current is carried through the line itself, or an already-installed heating coil is activated.

In accordance with yet an additional mode of the invention, there is provided a method which comprises heating the installed or laid line for oxidation with a hot oxygen-containing gas flowing past the line.

In accordance with still another mode of the invention, there is provided a method which comprises cooling the installed or laid line after oxidation to the operating temperature of the superconductor to be formed.

In accordance with still a further mode of the invention, there is provided a method which comprises cooling the installed or laid line after oxidation to a temperature below the boiling point of nitrogen.

A particularly high strength of the oxide film is attained if, after the oxidation, the laid connecting line is immediately cooled to the operating temperature of the superconductor which, for instance, is below the boiling point of nitrogen.

With the foregoing and other objects of the invention in view, there is also provided a combination superconducting connecting line and apparatus for producing the superconducting connecting line, comprising a superconducting connecting line installed or laid with at least one layer formed of a metal alloy forming a superconducting oxide, a hollow line bordering said layer, means for heating said superconducting connecting line, and means for supplying said hollow line with an oxygen-containing gas.

The line can also be entirely formed of a metal alloy forming a superconducting oxide, or it may be coated wit such an alloy. The essential point is that at least one strip which is made of such an alloy and is uninterrupted in the longitudinal direction of the line, is present.

In accordance with another feature of the invention, the superconducting connecting line is a tube defining said hollow line therein, said tube has an inner surface on which said at least one layer is disposed, and said supplying means supplies said tube with the oxygen-containing gas for oxide formation and with a coolant in the finished state for maintaining superconduction after the superconducting oxide is formed. The tube may have any arbitrary cross section. For example, a box-shaped profile is also possible.

In accordance with a further feature of the invention, the superconducting connecting line has an outer surface on which said at least one layer is disposed, and there is provided a tube surrounding said superconducting connecting line at a distance defining said hollow line therebetween, said supplying means supplying said hollow line with the oxygen-containing gas for formation of the oxide and with a coolant to assure superconduction after the superconducting oxide is formed.

In accordance with an added feature of the invention, the superconducting connecting line is a hollow first tube, said first tube has an outer surface on which said at least one layer is disposed, and including a second tube surrounding said first tube at a distance defining said hollow line therebetween, and means for supplying said first tube with a coolant after the superconducting oxide is formed, said supplying means supplying said hollow line with the oxygen-containing gas. In operation, dry air can be supplied to the space, for insulation purposes.

In accordance with still another feature of the invention, the superconducting connecting line is formed of a metal alloy forming a superconducting oxide.

In accordance with an additional feature of the invention, the superconducting connecting line is formed of an electrically conductive material, such as copper. If copper or some other material with good conduction is used, an electrical connection, even if not a superconducting electrical connection, is always available, even if the superconducting oxide film should become interrupted. Known coating methods can be used for applying the alloy. For example, the film can be rolled on. It is also possible for the entire connecting line to be formed of a metal alloy that forms a superconducting oxide, or for only a strip extending along the line to be coated with such an alloy.

In accordance with yet another feature of the invention, the heating means are in the form of a heating coil.

In accordance with yet a further feature of the invention, the heating means include a voltage source.

In accordance with yet an added feature of the invention, the supplying means for oxygen containing gas includes a connection fitting.

In order to enable a repair of an already-laid or installed superconducting connecting line by the method according to the invention, without interrupting the transmission of energy, a plurality of identical superconductors laid parallel to one another are used for one energy transmission line.

When this redundant structure, it is possible to shut off one of the superconductors for repair purposes. Repair is necessary if the oxide surface is damaged. Through the use of heating and supplying an oxidizing gas in accordance with the method of the invention, a new oxide film is formed from the still-undamaged alloy, at the site where this alloy is not covered by oxide.

With the method according to the invention for producing a superconducting connecting line, and with the apparatus for performing this method, the advantage in particular is attained that a mechanically stable superconducting connecting line suitable for transmitting energy over long distances is made available, which moreover can be repaired in a simple manner while in a laid condition, in other words in situ, without the need to locate any possible defect in the oxide film.

With the objects of the invention in view, there is additionally provided a superconducting connecting line, comprising at least one layer formed of a metal alloy forming a superconducting oxide by heating and exposure to an oxygen-containing gas, and a hollow line bordering said layer for receiving the oxygen-containing gas.

In accordance with another feature of the invention, there is provided an outer surface on which said at least one layer is disposed, and a tube surrounding said superconducting connecting line at a distance defining said hollow line therebetween, said hollow line receiving the oxygen-containing gas and receiving a coolant to assure superconduction after the superconducting oxide is formed.

In accordance with a further feature of the invention, there is provided a tube defining said hollow line therein, said tube having an inner surface on which said at least one layer is disposed, and said tube receiving the oxygen-containing gas and receiving a coolant after the superconducting oxide is formed.

In accordance with a concomitant feature of the invention, there is provided a hollow first tube, said first tube having an outer surface on which said at least one layer is disposed, and a second tube surrounding said first tube at a distance defining said hollow line therebetween, said hollow line receiving the oxygen-containing gas and the first tube receiving a coolant after the superconducting oxide is formed.

Other features which are considered as characteristic for the invention are set forth in the appended claims.

Although the invention is illustrated and described herein as embodied in a superconducting connecting line and a method and apparatus for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments which read in connection with the accompanying drawings.

DESCRIPTION OF THE PREFERRED EMBODIMENT

Figure 1:
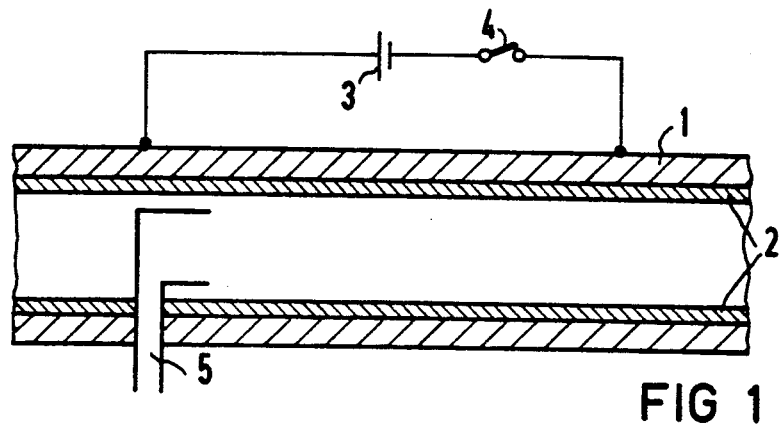
FIG. 1 is a fragmentary, diagrammatic, longitudinal-sectional view of a superconducting connecting line or lead wire according to the invention.

Referring now to the FIGURES of the drawing in detail and first, particularly, to FIG. 1 thereof, there is seen an initially laid or run line or lead wire formed of a copper tube 1, having an inner surface which is provided with a layer 2 that is formed of a metal alloy forming a superconducting oxide. The copper tube 1 communicates with a voltage source 3, from which a heating current can be carried through the copper tube 1 such as through a heating coil, by the closure of a switch 4. The copper tube 1 also communicates with a connection fitting 5 for a gas that contains oxygen. If the copper tube is heated and oxygen-containing gas is simultaneously brought into contact with the layer 2, then a superconducting oxide film forms.

Figure 2:
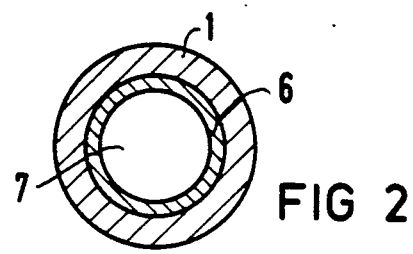
FIG. 2 is a cross-sectional view of the same connecting line.

FIG. 2 shows a cross section through the finished superconducting connecting line. The copper tube 1 has a superconducting oxide film 6 on the inside. Coolant, such as liquid nitrogen, is carried through the inner cross section or hollow line 7 of the finished line during operation.

Figure 3:
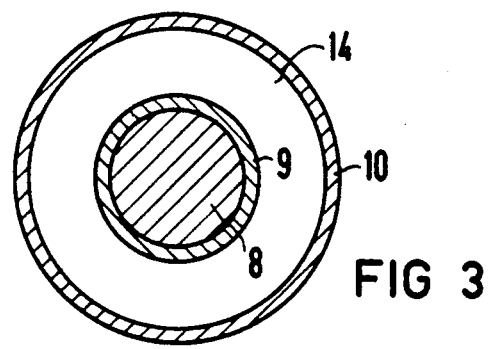
FIGS. 3 and 4 are cross-sectional views showing variations of the superconducting conducting line.

FIG. 3 shows a variation of a superconducting connecting line, in which a copper cable 8 is laid or run rather than a copper tube. The copper cable is covered completely by a superconducting oxide film 9. The coated copper cable 8 is located inside a tube 10. An annular space or hollow line 14 between the cable 8 and the tube 10 carries an oxygen-containing gas in order to form the oxide film 9 and carries a coolant during operation.

Figure 4:
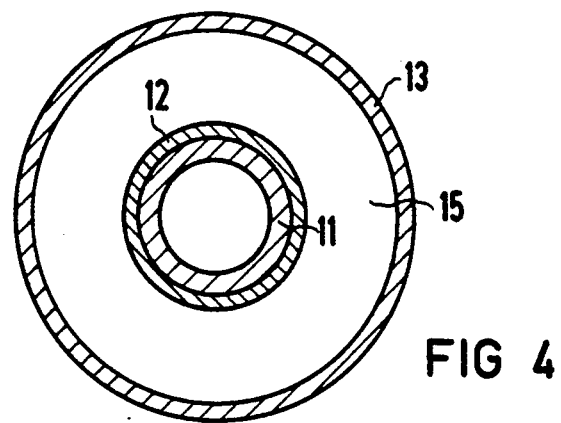

In accordance with FIG. 4, a further superconducting connecting line is formed of a copper tube 11, which is provided with a superconducting oxide film 12 on the outside thereof.

The copper tube 11 is disposed in a tube 13. In order to form the oxide film 12, a gas that contains oxygen is carried through an annular space or hollow line 15 between the copper tube 11 and the tube 13. During operation, the copper tube 11 receives coolant, such as liquid nitrogen. The annular space 15 between the copper tube 11 and the tube 13 is then filled with an inert, dry gas for insulation purposes.

The foregoing is a description corresponding in substance to German Application P 38 08 474.0, dated Mar. 14, 1988, the International priority of which is being claimed for the instant application, and which is hereby made part of this application. Any material discrepancies between the foregoing specification and the aforementioned corresponding German application are to be resolved in favor of the latter.

I claim:

1. Method for repairing an oxide superconducting connecting line produced by forming a connecting line with a coating surface accessible for forming a superconducting layer thereon, coating the surface with a layer of crystalline or amorphous metal alloy having a melting temperature, installing the line at a location over a large distance, subsequently at least partially heating the installed line to a temperature below the melting temperature, and simultaneously bringing a gas containing oxygen reactive with the metal alloy into contact with the accessible surface and oxidizing an accessible portion of the layer for forming an oxide film on the layer and producing a compressive stress in the oxide film and forming an oxide superconducting layer upon cooling, wherein the repairing method comprises repairing the superconducting connecting line at a location where the oxide film is damaged by forming a new oxide film on the still-undamaged alloy layer by heating the line at the damaged location to a temperature below the melting temperature, and simultaneously bringing a gas containing oxygen reactive with the metal alloy into contact with the accessible surface at the damaged location and oxidizing an accessible portion of the layer for forming an oxide film on the layer and producing a compressive stress in the oxide film and forming the superconducting layer upon cooling.

2. Method for repairing an oxide superconducting connecting line produced by forming at least a portion of a connecting line of material with at least one layer thereon of a crystalline or amorphous metal alloy having a melting temperature and a surface accessible for forming a super conductive oxide thereon, installing at a location the connecting-line portion connected to at least another connecting-line portion, then heating the connecting-line portions at the location to a temperature below the melting temperature, and simultaneously bringing a gas containing oxygen reactive with the metal alloy into contact with the accessible surface for forming an oxide film thereon and producing a compressive stress in the oxide film which is superconductive upon cooling, wherein the method comprises repairing the superconducting connecting line at a location where the oxide film is damaged by forming a new oxide film on the still-undamaged alloy layer by heating the damaged location to a temperature below the melting temperature, and simultaneously bringing a gas containing oxygen reactive with the metal alloy into contact with the accessible surface for forming an oxide film thereon and producing a compressive stress in the oxide film which is superconductive upon cooling.

* * * * *